United States Patent [19]
Kai et al.

[11] Patent Number: 5,134,300
[45] Date of Patent: Jul. 28, 1992

[54] METHOD AND APPARATUS FOR CONTROLLING CHARGED PARTICLE BEAMS IN CHARGED PARTICLE BEAM EXPOSURE SYSTEM

[75] Inventors: Junichi Kai, Tokyo; Hiroshi Yasuda, Yokohama; Kazutaka Taki, Kawasaki, all of Japan

[73] Assignee: Fujitsu Limited, Kawasaki, Japan

[21] Appl. No.: 751,588

[22] Filed: Aug. 22, 1991

Related U.S. Application Data

[63] Continuation of Ser. No. 630,706, Dec. 20, 1990.

[30] Foreign Application Priority Data

Dec. 21, 1989 [JP] Japan .................................. 1-329670

[51] Int. Cl.⁵ ............................................ H01J 37/302
[52] U.S. Cl. .................................. 250/492.2; 250/492.1
[58] Field of Search ............ 250/492.1, 492.2, 492.22, 250/492.21, 398, 492.3

[56] References Cited

U.S. PATENT DOCUMENTS

| | | | |
|---|---|---|---|
| 4,945,246 | 7/1990 | Davis et al. | 250/492.2 |
| 4,950,910 | 10/1990 | Yasuda et al. | 250/492.3 |

FOREIGN PATENT DOCUMENTS 0236224  11/1985  Japan ................................ 250/492.2

*Primary Examiner*—Jack I. Berman
*Assistant Examiner*—James Beyer
*Attorney, Agent, or Firm*—Staas & Halsey

[57] ABSTRACT

A charged particle beam exposure system employs a continuously moving stage technique and a double deflection technique. The system stably deflects charged particle beams and reliably exposes a sample to the beams with no overflow. The system positively moves a major deflector from one subfield to a particular position of another subfield on the sample for period corresponding to a settling time that is usually needed for a subfield-to-subfield jump of the major deflector, and then exposes the sample to the beams.

9 Claims, 18 Drawing Sheets

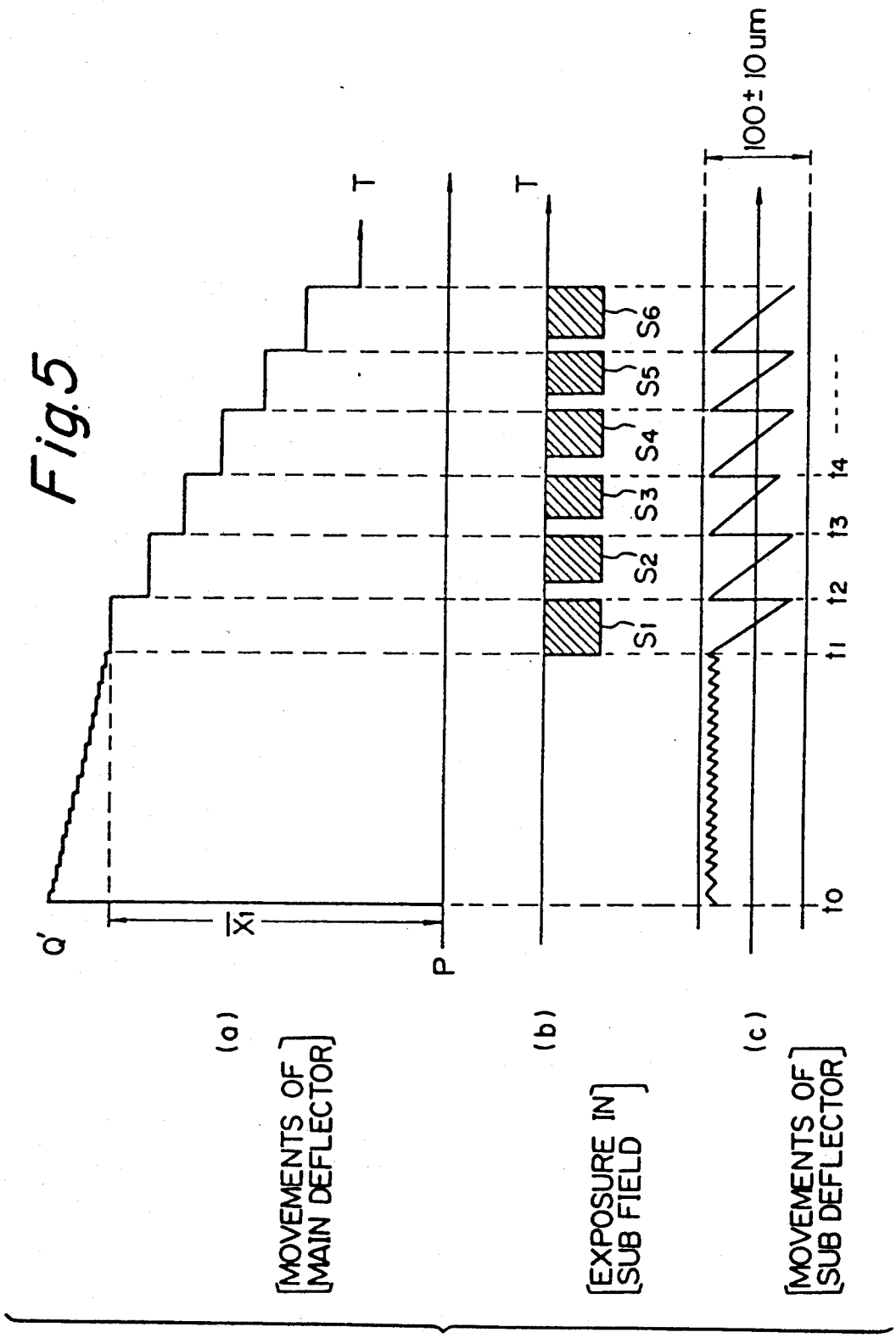

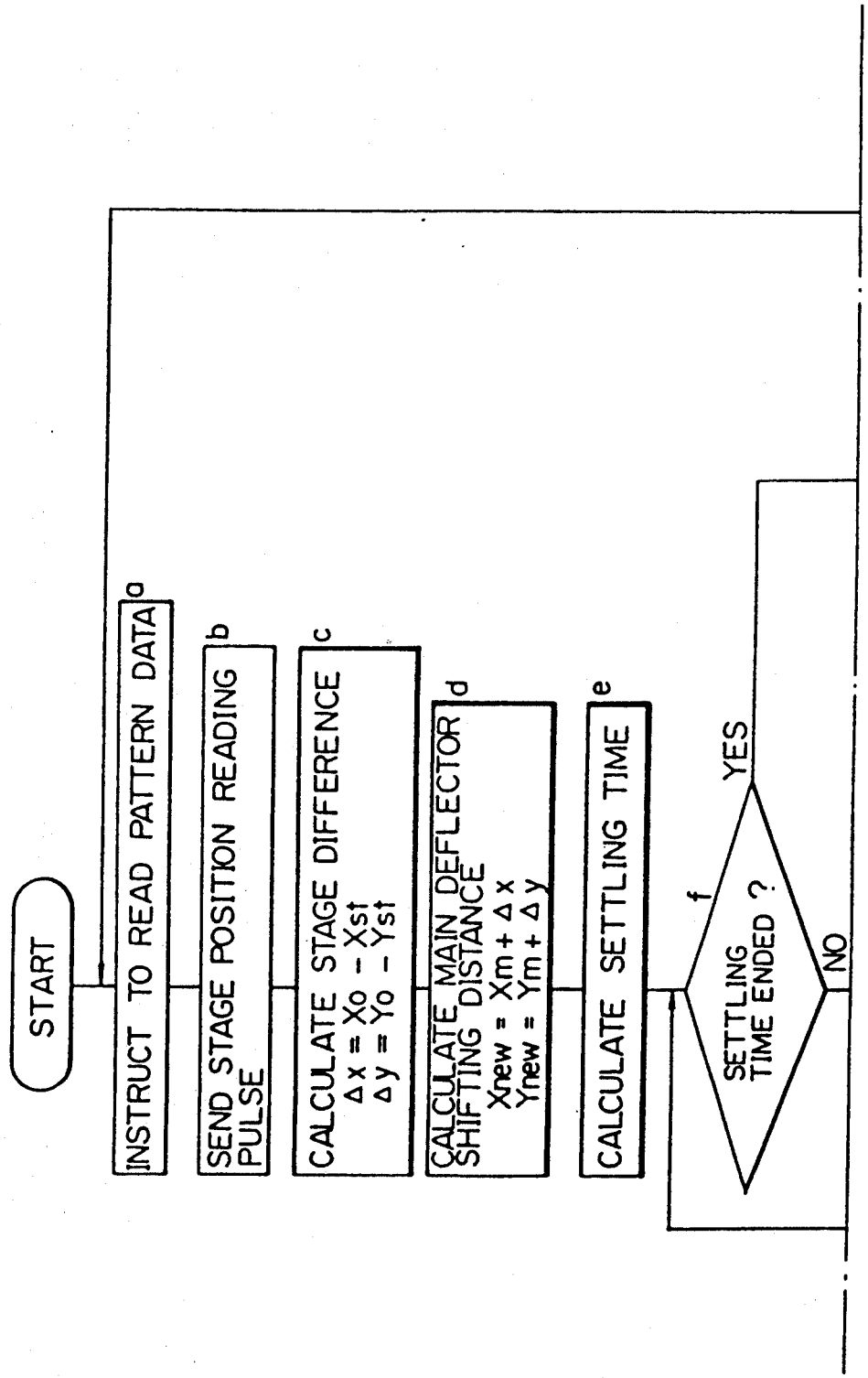

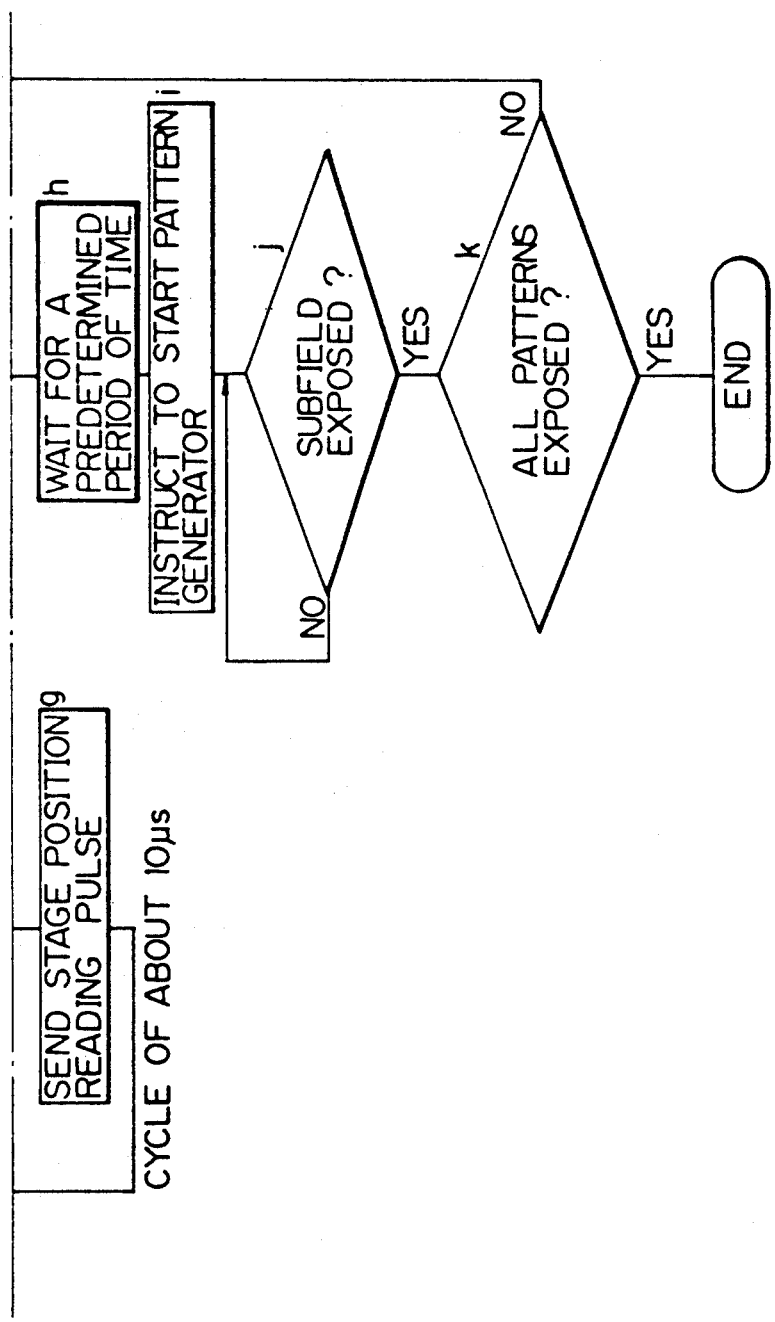

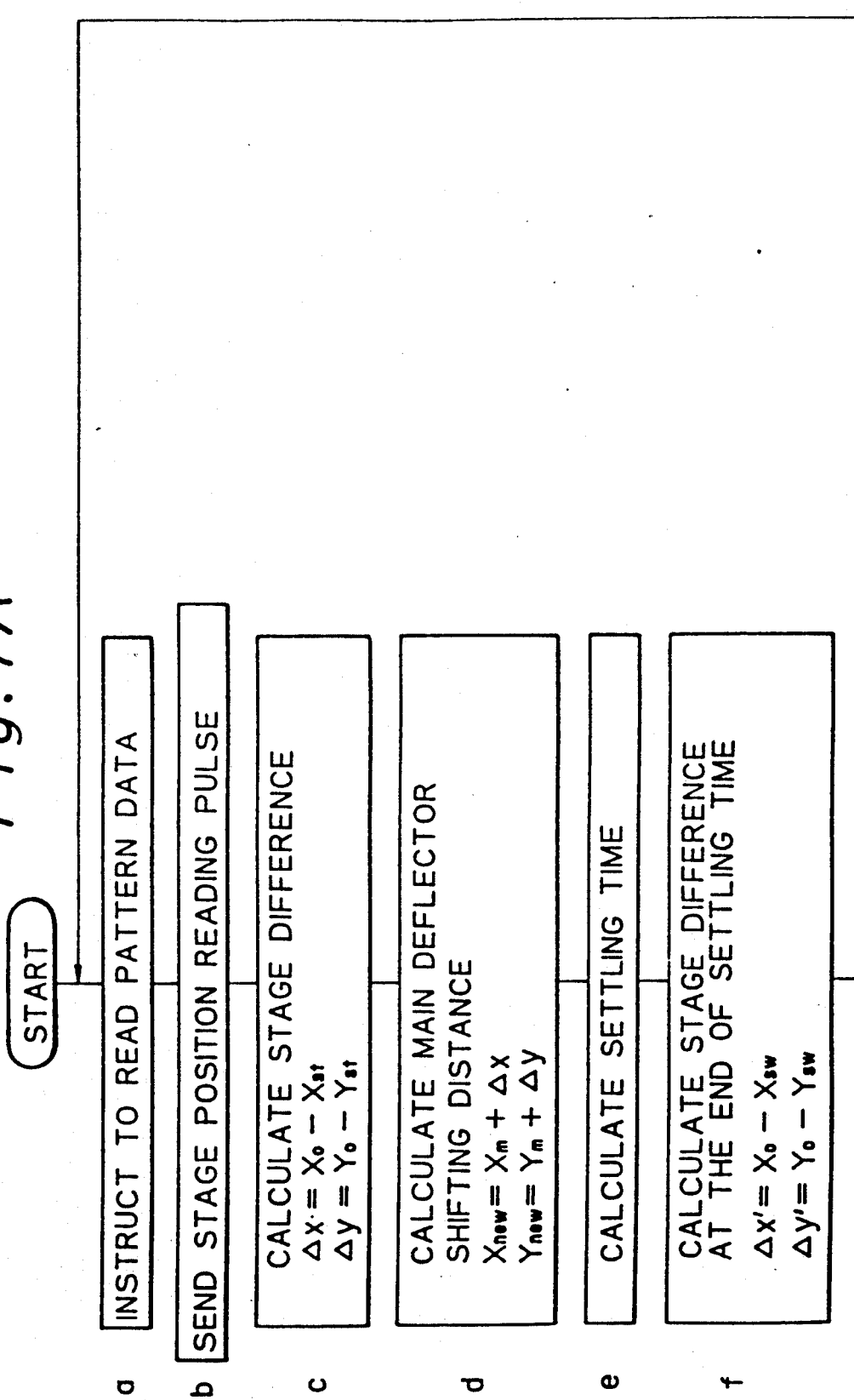

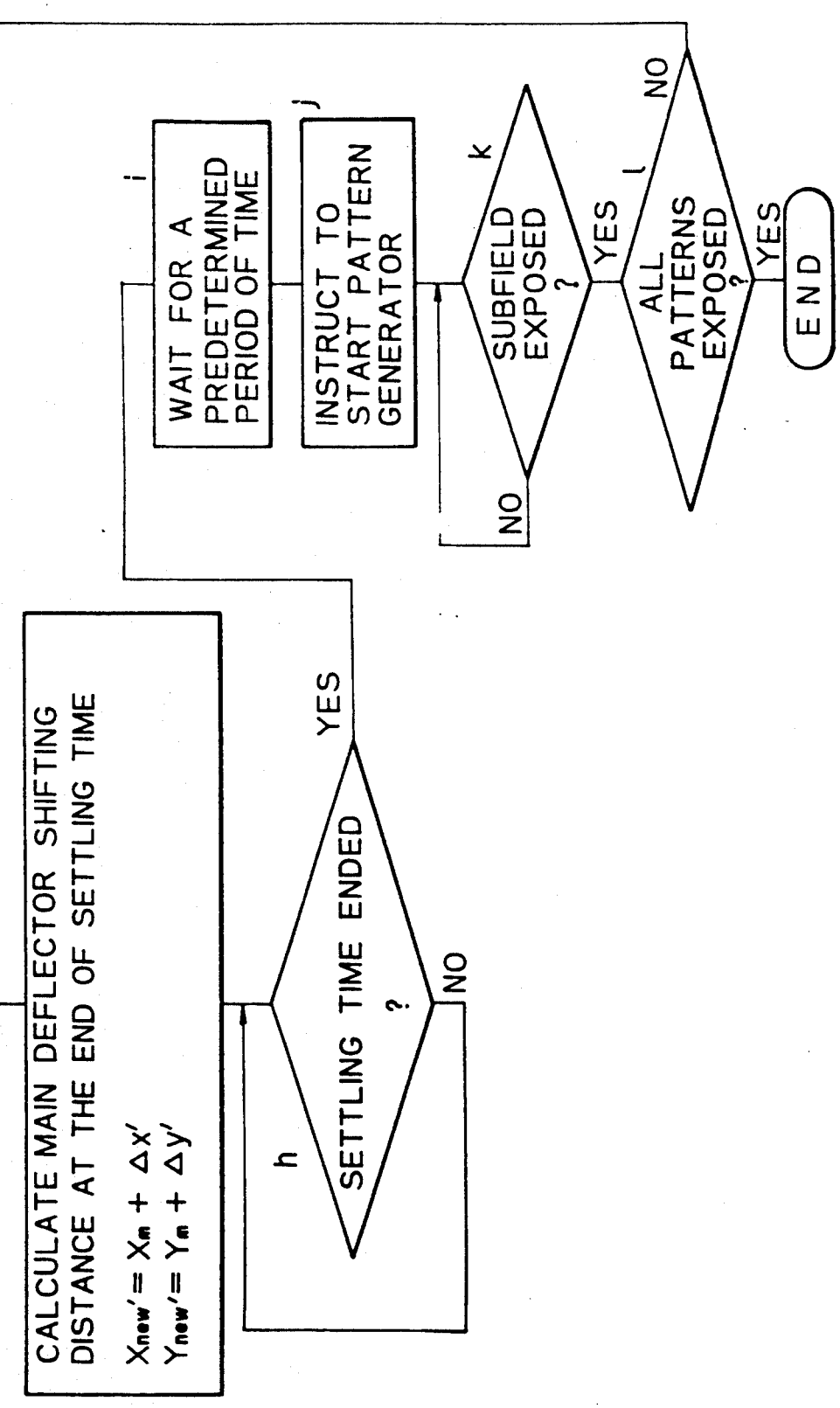

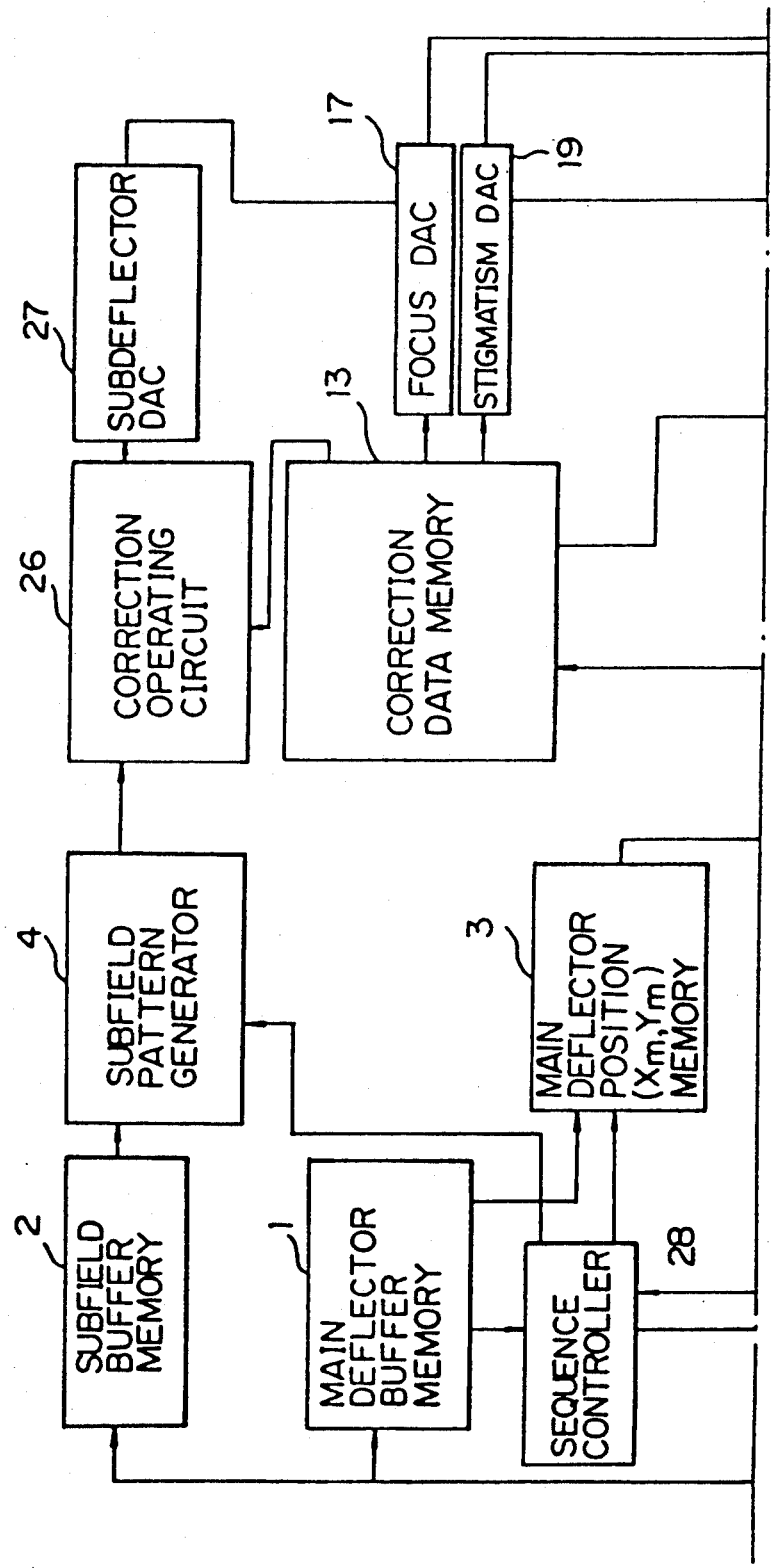

S1

SMALL AREA 1　　　　SMALL AREA 2

METHOD AND APPARATUS FOR CONTROLLING CHARGED PARTICLE BEAMS IN CHARGED PARTICLE BEAM EXPOSURE SYSTEM

This application is a continuation of application Ser. No. 630,706, filed Dec. 20, 1990, now abandoned.

BACKGROUND OF THE INVENTION

1. Field of the Invention

The present invention relates to a charged particle beam exposure method, and particularly to a method of controlling beam deflection in a charged particle beam exposure system that employs a continuously moving stage technique and a double deflection technique.

2. Description of the Related Art

To improve the throughput of a charged particle beam exposure system, one attractive method is to continuously move a stage while exposing a sample on the stage to beams using the double deflection technique to draw required patterns on the sample.

According to this method, a sample to be placed on the continuously moving stage and exposed to beams is divided into a plurality of main fields (each, for example, 2 mm square), and each of the main fields is divided into subfields (each, for example, 100 $\mu$m square). A major deflector deflects a charged particle beam to a predetermined position of the main field. The major deflector mainly comprises an electromagnetic deflecting coil having a wide deflection width and a relatively slow deflection speed. A minor deflector forms a pattern on each exposure section in each subfield. The minor deflector mainly comprises an electrostatic deflector having a narrow deflection width and a relatively high deflection speed.

Since the stage moves continuously during exposure, the major deflector and minor deflector must be controlled according to movements of the moving stage to correctly deflect a beam at any time. This is very important in order to draw predetermined patterns at predetermined positions.

In adjusting a deflector within a certain range according to an instruction signal, it is necessary to consider a settling time of the deflector. Due to actions of coils, amplifiers, etc., of the deflector, the deflector needs some settling time to stabilize itself at a specified position.

The minor deflector generally exposes a sample at a speed of about 100 nsec, and therefore, finishes the exposure of each subfield of the sample in 150 nsec (about 6 MHz). A settling time of the minor deflector is said to be 30 to 50 nsec. This amount of settling time does not cause a severe problem in exposure.

On the other hand, the major deflector for deflecting a beam toward a main field of the sample needs a settling time of about 20 $\mu$sec for a jump distance of 100 $\mu$m because the major deflector employs electromagnetic deflection. For a jump distance of 2 mm, the major deflector needs a settling time of at least 1 msec. This long settling time is due to inductance of the coil and a magnetic field produced by an eddy current flowing through lens conductors, and causes a serious problem in adjusting the major deflector.

The composite of FIGS. 1A to 1C (hereafter, "FIG. 1") shows an example of the conventional charged particle beam exposure system employing the continuously moving stage technique and double deflection technique.

In FIG. 1, a major deflector buffer memory 1 stores positions (coordinates) of a major deflector for subfields S1 to Sn. As shown in FIG. 2, the center of each main field M forms an original point Cm of a coordinate system for pattern data of the subfields S1 to Sn contained in the main field M. A subfield buffer memory 2 stores the pattern data for the subfields S1 to Sn.

To draw patterns in a selected main field M, a major deflector position (coordinate) X1 of a selected subfield in the main field M is read out of the memory 1. ("Main" and "major" are used synonymously herein.) The coordinate X1 is design data that represents, for example, the center of the selected subfield. The read coordinate X1 is stored in a major deflector position memory 3.

Pattern data of the selected subfield (one of the subfields S1 to Sn) of the main field M are read out of a subfield coordinate section of the memory 2. At this time, a subfield pattern generator 4 is not yet activated.

At the instant when the major deflector coordinate X1 of the subfield is stored in the major deflector position memory 3, a laser interferometer 6 reads a position (coordinate) of a stage 5. The read coordinate is passed through a laser counter 7 and stored in a stage read register 8. A subtracter 10 computes a difference between the coordinate stored in the stage read register 8 and a target position on the stage 5 where the center of the main field M must exist, stored in a stage target register 9. An adder 11 adds the difference computed by the subtracter 10 to the major deflector coordinate X1 of the selected subfield, and provides a distance $\overline{X1}$ (a major deflector shifting vector) for shifting the major deflector along, for example, an axis X. The vector $\overline{X1}$ is stored in a major deflector shifting coordinate memory 12.

The minor deflector is also corrected according to movements of the stage. Since the stage continuously moves, the direction and width of deflection of each deflector must always be checked and controlled. To efficiently achieve tis, the position of the major deflector in a subfield at a certain instant is read and determined, and the major deflector is shifted to and fixed at a required position. Thereafter, the minor deflector is feedback-controlled to control the deflection width thereof in response to the movements of the stage as well as to control the drawing of patterns in the subfield. Namely, once the position of the major deflector is read at a certain moment, a coordinate $\overline{X1}$ (a major deflector shifting vector) according to which the major deflector is to be adjusted is determined as mentioned above.

To correct a rotation error of the major deflector as well as a deflection sensitivity error of a major amplifier, the main deflection shifting vector $\overline{X1}$ is passed through a major deflector correction operating circuit 14 to provide a data signal to a major deflector DAC (Digital Analog Converter) 15.

A set strobe is applied to the major deflector DAC 15 at a certain time after the major deflector coordinate of the selected subfield is read out of the memory 1. This is because the major deflector needs a certain settling time after it is shifted to the specified coordinate position. To actually operate the major deflector to expose a selected one of the subfields S1 to Sn in the main field M and draw patterns in the selected subfield after the settling time, a latency time generator 21 is provided. The output signal of the latency time generator 21 activates the pattern generator 4 for the subfield (S1 - Sn).

The latency time varies depending on the coil and amplifier of the major deflector, and is usually 1 msec for a jump distance of 2 mm.

After the major deflector is oriented to the main field M, the major deflector is successively fixed to particular coordinates of the subfields S1 to Sn, and at each time, the pattern generator is operated after the latency time to deflect charged particle beams. If gain data and rotation data for the minor deflector are needed, these data are read from the correction data memory 13 and stored in a minor deflector correction operating circuit 26, in which an output of the subfield pattern generator 4 is corrected. The circuit 26 provides minor deflector adjusting data to a minor deflector DAC 27. ("Minor" and "sub-" are used synonymously herein.)

A subtracter 22 calculates a difference between a position of the stage 5 read at read timing and stored in the stage read register 8, and a count of the laser counter representing a present position of the stage 5. The subtracter 22 provides the difference to a minor deflector feedback correction operating circuit 23, which provides its data to a minor deflector feedback DAC 24.

A deflection signal for each shot provided by the pattern generator 4 for the minor deflector and the feedback signal are converted into analog signals by DACs 27 and 24, respectively. The reason for this is because, for the deflection signal, intervals of strobe pulses fluctuate depending on exposure clocks for respective shots, while the feedback signal depends on up/down pulses (a pulse interval is 60 nsec [15 MHz] when the stage moves at a speed of 70 mm/sec at an accuracy of $\lambda/120 = 0.0051$ $\mu$m) of a laser interferometer of the stage. It is difficult, therefore, to form synchronous signals for the deflection signal and feedback signal. It is not necessary to synchronize digital pulses and no digital operational errors occur if the signals are converted into analog signals and then added to each other.

According to the conventional charged particle beam exposure system mentioned above, the major deflector is deflected from one subfield S1 in the main field M to an adjacent subfield S2 in the same main field with a certain settling time T1 as described before. When the major deflector is going to be shifted from the subfield S1 to the adjacent subfield S2, or to a certain subfield of an adjacent main field, beam emission is usually stopped and deflector shifting is not carried out, if a value of a vector sum of a distance between a target stage position and a present stage position and an output value of the major deflector which is the main deflector coodinate ($X_1$, $Y_1$) of the subfield. (i.e., a major delector shifting vector [$X_1$, $Y_1$] finally output to the major deflector DAC 15.) is longer than a drawable area (for example, 2 mm). After the stage moves to shorten the distance and enter the drawable area, the major deflector is shifted to the center of an edge subfield (for example, a lower left subfield) of the adjacent main field. To shift the major deflector, a shifting vector $\overline{X1}$ of the major deflector is calculated as mentioned before. This vector $\overline{X1}$ corresponds to a distance between points P and Q shown in FIG. 4.

An actual movement of the major deflector from the point P to the point Q follows a dashed line K or K' shown in FIG. 4, and it usually requires a latency time of 1 msec for a jump of 2 mm. This latency time is dead time because beam exposure must be stopped during the latency time. The latency time is, therefore, a bottleneck for improving the throughput of the exposure system. During the latency time of 1 msec, the stage is continuously moving. To carry out exposure after the latency time, it is necessary, therefore, to calculate a correction value according to a difference between a target position and a present position of the stage, and adjust the major deflector according to the correction value. This correction involves another latency time and positional deviation. This means that the correction process must be repeated endlessly, thereby complicating the whole process.

For example, it is supposed in the above-mentioned conventional system that the width of one main field is 2 mm, a jumping distance of the major deflector is 2 mm at the maximum, a latency time after a jump of the major deflector is 1 msec, and a possible range of feedback control of the minor deflector for compensating movements of the stage is $\pm 10$ $\mu$m, i.e., a band of 20 $\mu$m.

When the stage is moving at about 5 mm/sec or slower for a low-speed exposure, the stage moves only 5 $\mu$m during the latency time of 1 msec, so that, by adding 10 $\mu$m to the minor deflector feedback circuit in advance, the minor deflector feedback control will be effective for a range of 15 $\mu$m. In this case, even if the pattern generator starts after the latency time of 1 msec, there is still a time margin of 3 msec in exposing a subfield, so that the subfield may be sufficiently exposed.

When the stage is moving at 50 mm/sec for faster exposure, a problem occurs. Since the allowable width of the feedback control for a subfield is 20 $\mu$m, the stage stays only for 400 $\mu$sec in the minor deflector feedback range. It is necessary, therefore, to always judge whether or not the position of the stage overflows the subfield feedback range. If it overflows, the major deflector must follow the stage position, or the pattern generator must be stopped.

No overflow may occur on the minor deflector feedback control range if the pattern generator is not expected to operate, or during a waiting time for a major deflector jump. Once the overflow occurs just after the start of exposure, or after several exposures, the exposure must be stopped. Namely, the exposure is done irregularly, if an overflow occurs. This sort of irregular control cannot improve the throughput of the exposure system and cannot draw uniform patterns because it causes dislocation of patterns and changes in exposure conditions.

SUMMARY OF THE INVENTION

An object of the present invention is to provide a charged particle beam exposure system that can solve the drawbacks of the conventional techniques, eliminate a latency time which occurs in shifting a major deflector, stabilize exposure, and secure high-speed exposure with no overflow.

In order to accomplish the object, a first aspect of the present invention provides a method of controlling charged particle beams in a charged particle beam exposure system in which a sample is placed on a stage that is continuously moved, the sample having a plurality of main fields each including a plurality of subfields each of which involves a plurality of exposure sections, the system employing a major deflector having a wide beam deflecting width and a minor deflector having a narrow beam deflecting width to expose the sample to charged particle beams and draw selected variable patterns on the sample, the method comprising the steps of:

successively shifting the major deflector correspondingly the beam from one subfield to another one of the subfields and fixing the major deflector at and correspondingly moving the beam to a particular position in the subfield to which the major deflector moved; and successively shifting the minor deflector correspondingly the beam to the exposure sections in the subfield at which the major deflector is fixed, thereby successively exposing the exposure sections by charged particle beams according to pattern data and drawing patterns on the exposure sections, wherein the major deflector, and correspondingly the beam when shifted from one subfield to another subfield, is positively moved toward a particular position of the subfield for a period corresponding to a settling time that is normally needed for a subfield-to-subfield jump of the major deflector.

According to a second aspect of the present invention, the major deflector, and correspondingly the beam when shifted from one subfield to another one of the subfields, is intermittently moved at predetermined fine intervals toward a particular position of the subfield for a period corresponding to the settling time that is normally needed for a subfield-to-subfield jump of the major deflector.

A third aspect of the present invention provides a method of controlling charged particle beams in a charged particle beam exposure system in which a sample is placed on a stage that is continuously moved, the sample having a plurality of main fields each including a plurality of subfields each of which involves a plurality of exposure sections, the system employing a major deflector having a wide beam deflecting width and a minor deflector having a narrow beam deflecting width to expose the sample with charged particle beams and thereby draw selected patterns on the sample, the method comprising the steps of:

successively shifting the major deflector and correspondingly the beam from one subfield to another one of the subfields and fixing the major deflector at and correspondingly moving the beam to a particular position in the subfield; and successively shifting the minor deflector and correspondingly the beam to the exposure sections in the subfield at which the major deflector is fixed, thereby successively exposing the exposure sections to charged particle beams according to pattern data and drawing patterns on the exposure sections, wherein each of those subfields having a probability of causing an overflow is divided into a plurality of small areas in advance, and the major deflector is successively shifted to and fixed at and the beam moved to the small areas in each of those subfields, thereby successively exposing the small areas.

According to the present invention, the major deflector and correspondingly the beam is shifted from a subfield to another subfield in one main field. Unlike the conventional techniques in which the major deflector is jumped 2 mm with a latency time of 1 msec, the present invention provides a deflection instruction signal for the major deflector and correspondingly the beam to shift it toward a specified subfield in the main field at proper fine intervals that are determined according to the movement of the stage and the shifting speed, while detecting at fine intervals the difference between a target position and a present position of the stage. When the major deflector and correspondingly the beam reaches the target exposure position, exposure work can be started at once with no concern for latency time.

If the stage is moving at a high speed and if the number of patterns to be drawn in a certain subfield is large enough to cause an overflow, the subfield is divided into small areas, which are then sequentially exposed. With this technique, unlike the conventional techniques, no overflow occurs, and the throughput of the exposure system improves.

BRIEF DESCRIPTION OF THE DRAWINGS

FIG. 5, in parts (a), (b) and (c), respectively, are views showing relations of a shifting state of the major deflector, subfield exposure timing, and a shifting state of a minor deflector;

FIGS. 6A and 6B, in the composite, are a flowchart showing a sequence of beam exposure processes according to the present invention;

FIGS. 7A and 7B, in the composite, are a flowchart showing a sequence of other beam exposure processes according to the present invention;

FIGS. 8A to 8C, in the composite, are a block diagram showing a charged particle beam exposure system according to another embodiment of the present invention;

DESCRIPTION OF THE PREFERRED EMBODIMENTS

Figure 1A:
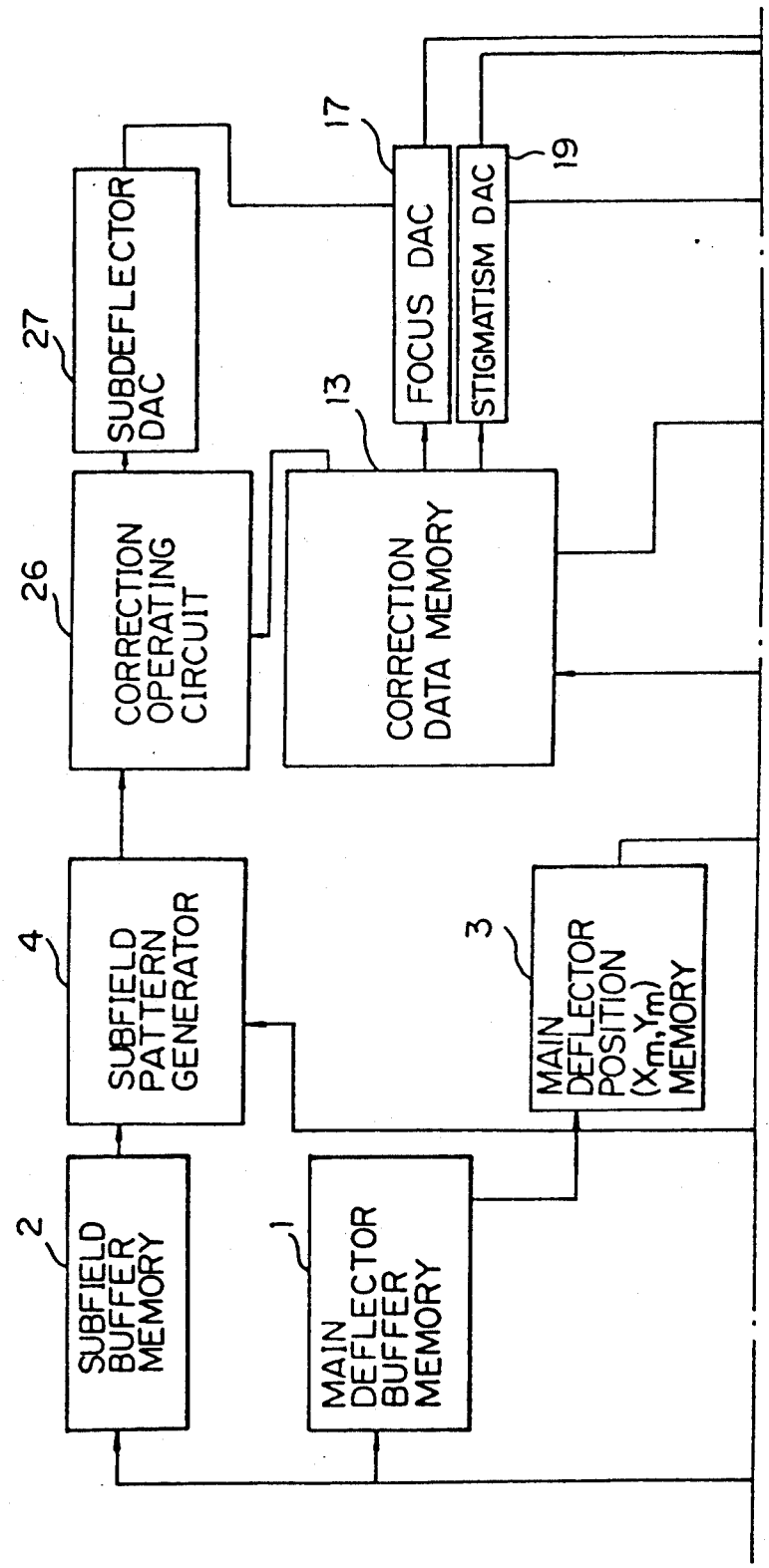
FIGS. 1A to 1C, in the composite, are a block diagram showing a charged particle beam exposure system according to the prior art.

The present invention provides, in principle, a charged particle beam exposing method employing a continuous stage moving technique and a double deflector technique. In deflecting a beam, a deflector needs some settling time after the deflector shifts to a target position until the deflector settles at the position. During this settling time, the stage is continuously moving to shift the target position. It is necessary, therefore, to repeatedly adjust the deflector, thereby elongating the settling time. The present invention is aimed at solving the problem of the extended settling time.

For this purpose, the present invention positively moves a major deflector during the settling time necessary for a jump of the major deflector, in shifting the major deflector from one subfield S1 to another subfield S2. After the major deflector is positively moved to a specific position in the subfield S2, exposure is started.

In one example of positively moving the major deflector according to the present invention, the major deflector is intermittently moved at predetermined fine intervals toward the specific position in the subfield during the settling time that is usually needed for a jump of the major deflector.

In another example of positively moving the major deflector according to the present invention, the settling time that is usually needed for a jump of the major deflector is calculated in advance, and based on the calculated settling time, a position where the major deflector is to be after the calculated settling time is predicted, and the major deflector is moved toward the predicted position.

Embodiments

A first embodiment of the present invention will be explained with reference to FIGS. 3, 5(a), 5(b), and 6.

In FIG. 5(b), a settling time T1 is divided by a predetermined interval Δt, and a major deflector is moved in a predetermined direction in each interval Δt. After the interval Δt, the present position of a stage is checked. Since the target stage position has been shifted, the target stage position is changed accordingly. After another interval Δt, the present position of the stage is again checked, and the target stage position is also changed. These operations are repeated until the settling time T1 elapses. After the settling time T1, the major deflector will be at a specified position in a subfield.

In this way, the embodiment positively uses the settling time that is never used by the conventional techniques, and during the settling time, repeats the correction and fine movements of the major deflector, thereby bringing the major deflector to a target position. When the major deflector reaches the target position, exposure work can be started at once.

In this embodiment, the major deflector moves only about two to three microns in the interval Δt, so that the settling time after such a short movement is insignificant. During the above movements of the major deflector, exposure work is stopped. The interval Δt is determined according to the moving speed of the stage, and the range of movement of the major deflector in which the settling time is insignificant.

Figure 1B:
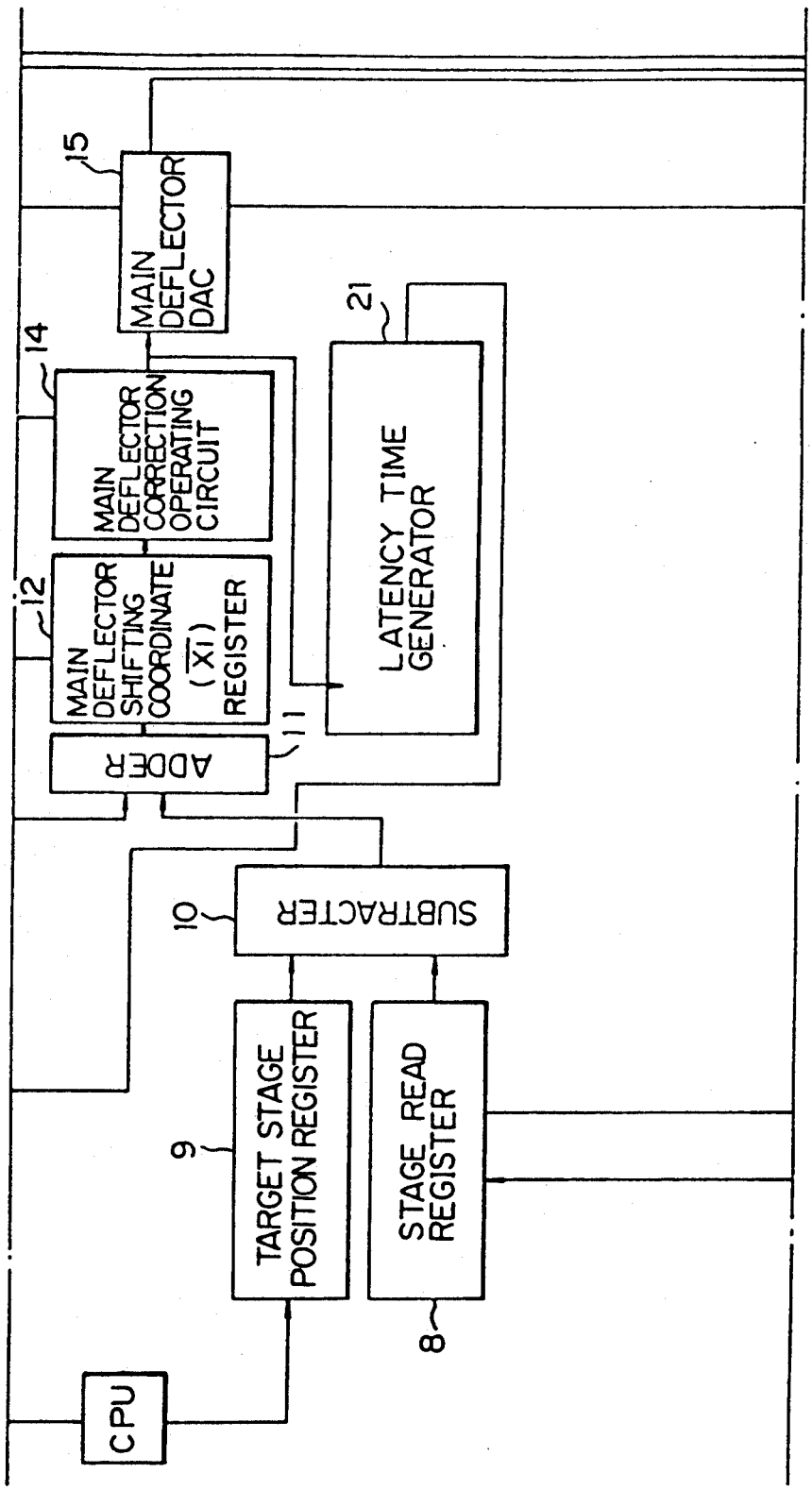
Figure 1C:
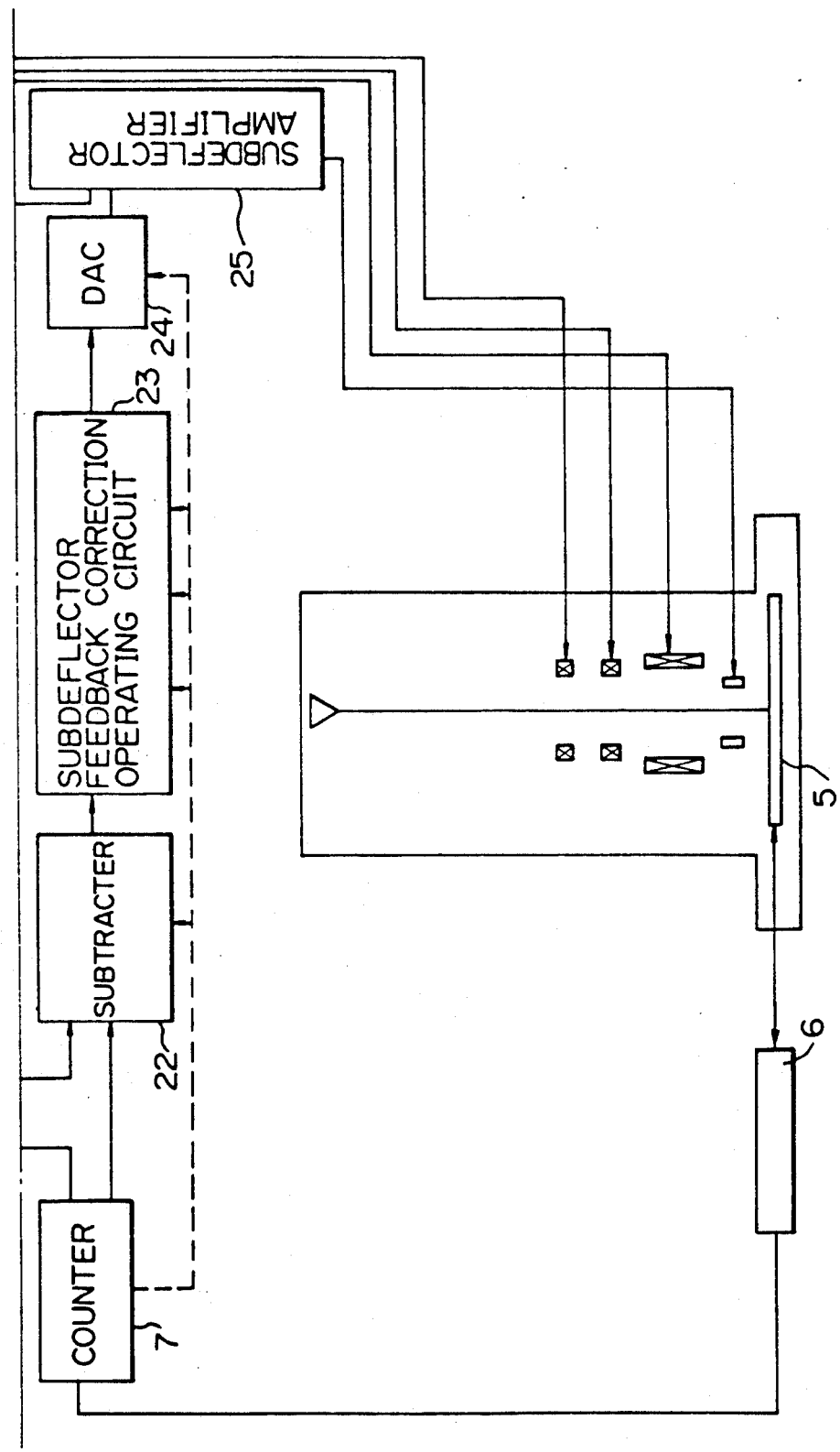
Figure 2A:
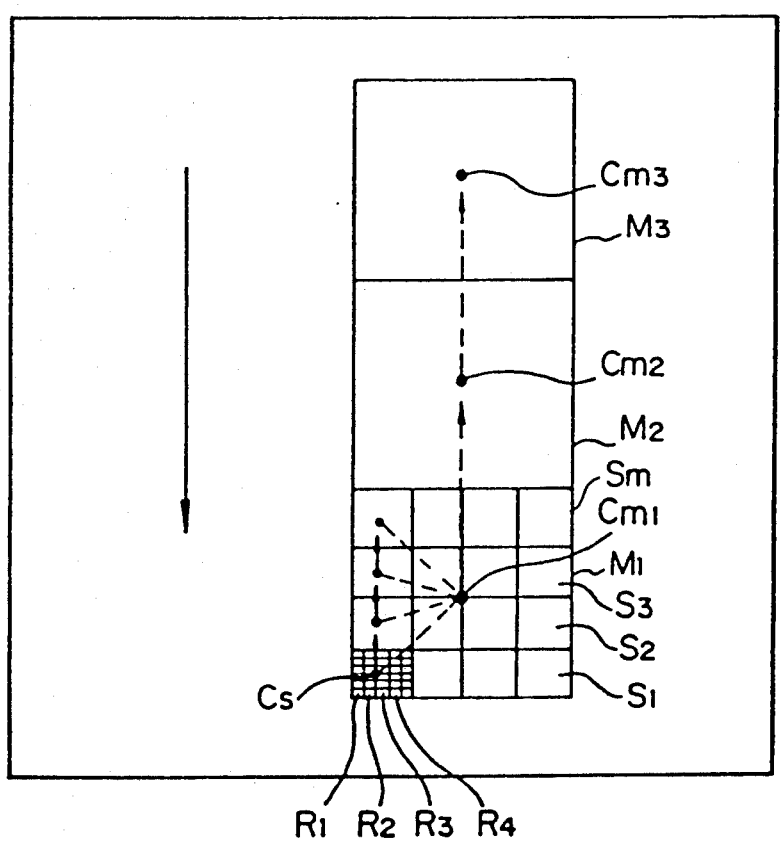
FIGS. 2A and 2B are views showing relations of main fields, subfields, and pattern data exposure sections.
Figure 2B:
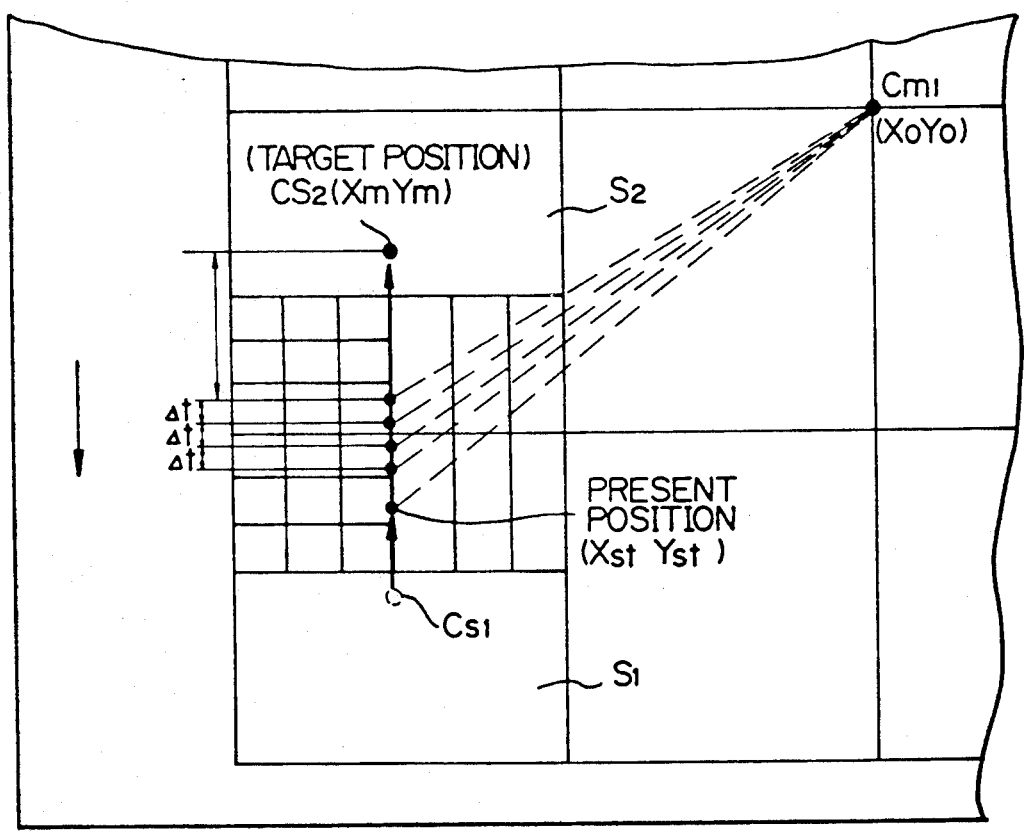
Figure 3A:
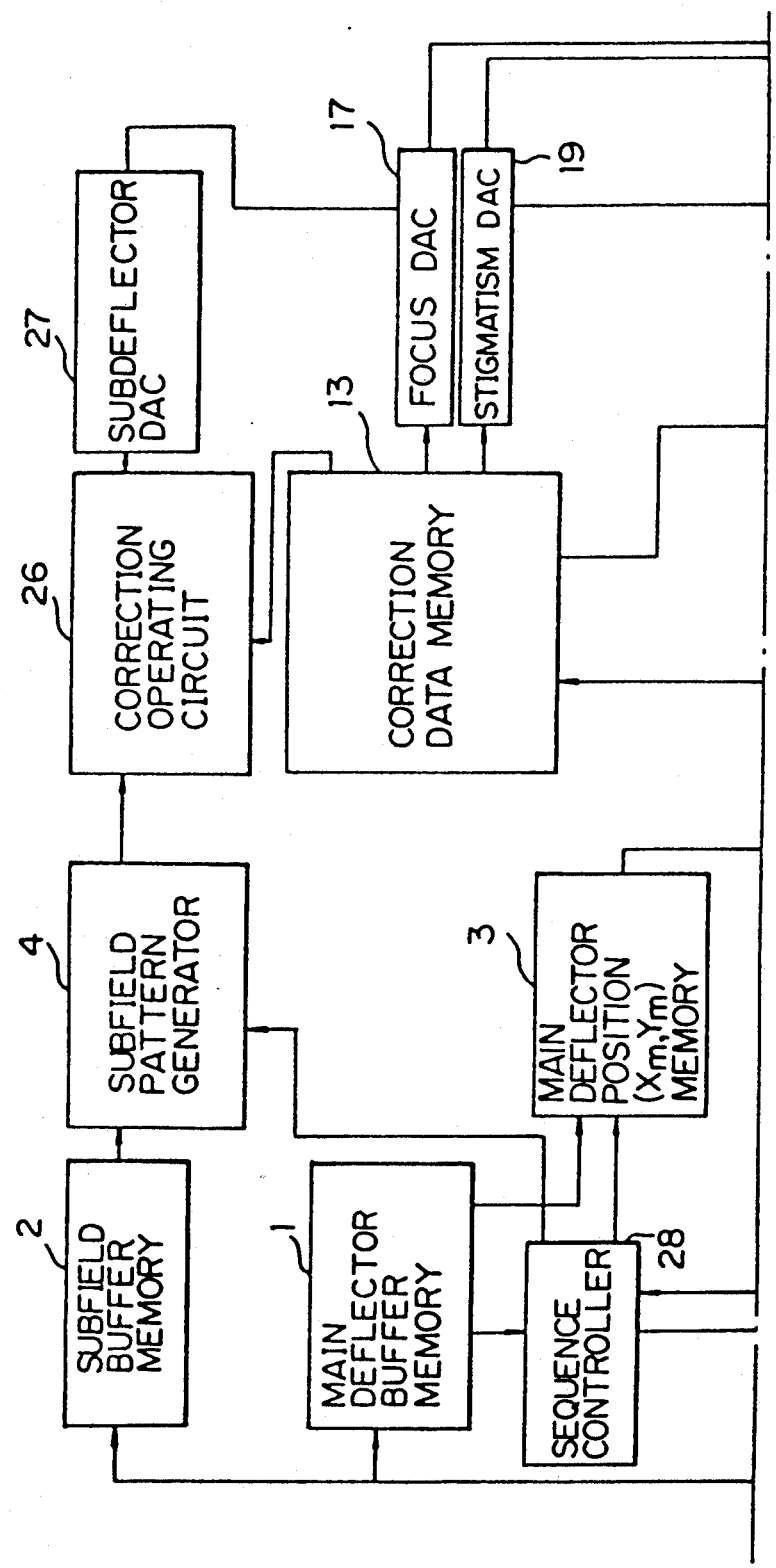
FIGS. 3A to 3C, in the composite, are a block diagram showing a charged particle beam exposure system according to an embodiment of the present invention.
Figure 3B:
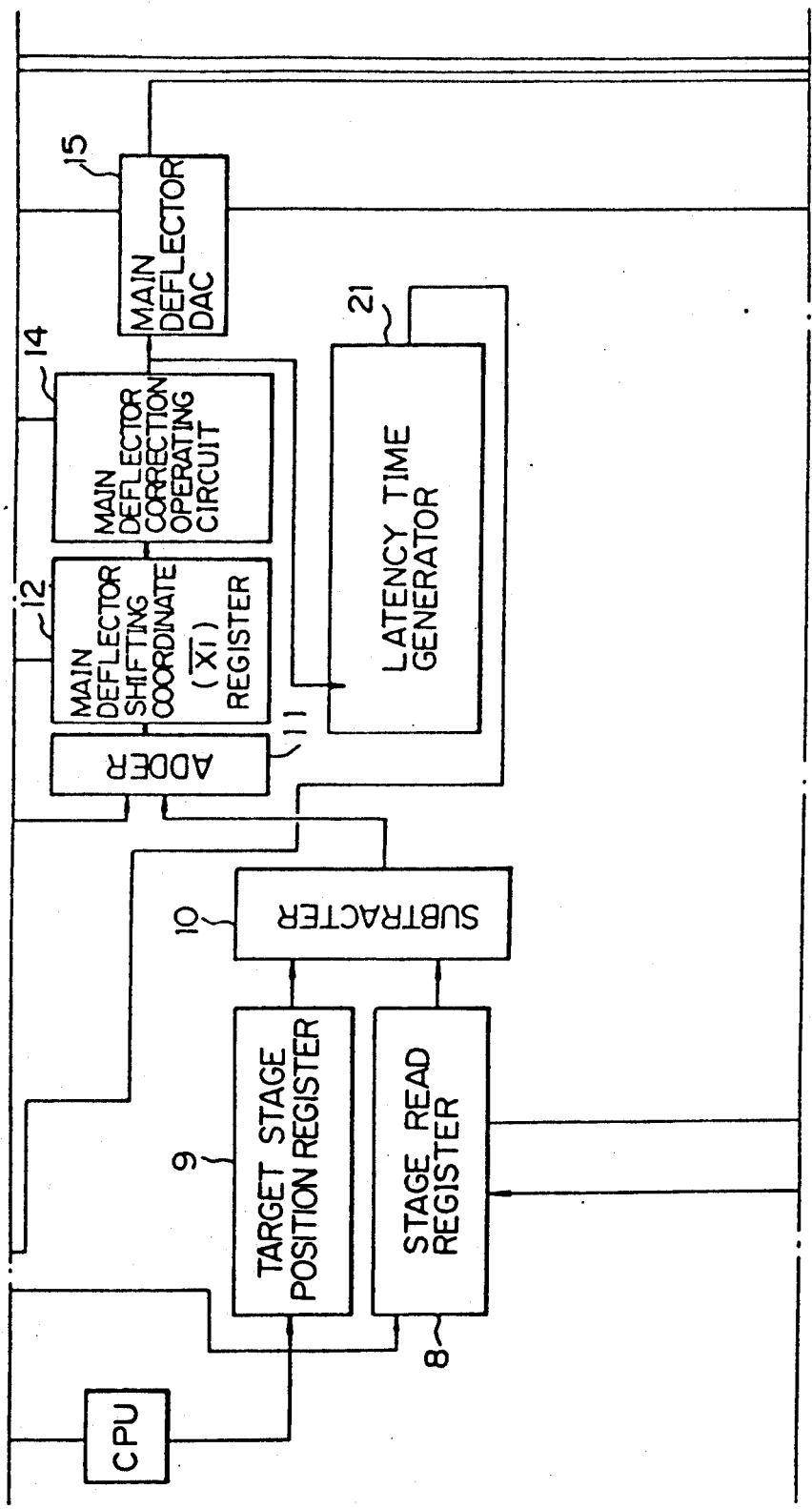
Figure 3C:
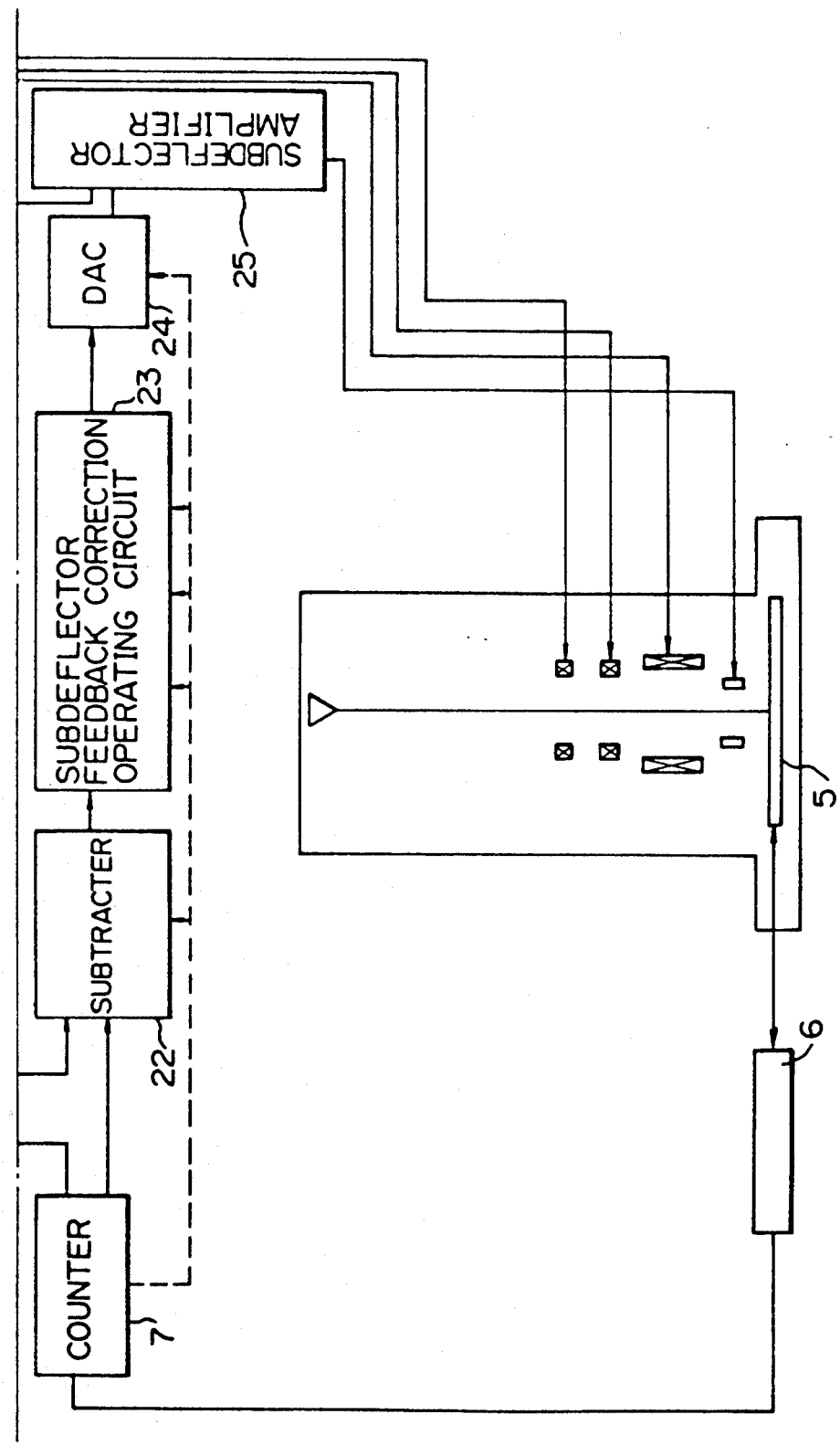

FIGS. 3A-3C (hereafter, FIG. 3) is a block diagram showing a charged particle beam exposure system according to the present invention. The same elements as those of FIG. 1 are represented with like numerals.

A movable range of the major deflector is preferably less than 2 mm for the sake of accuracy. In this embodiment, therefore, a movement of the major deflector from the center Cm1 of one main field to the center Cm2 of another main field is achieved by moving the stage instead of moving the deflector. Movements of the major deflector to be explained hereunder are movements thereof from one subfield to another subfield.

In FIG. 3, the major deflector is shifted from a subfield S1 to a data pattern exposure section R1 in another subfield S2 in one main field M1. To utilize a latency time T1 needed for this shift, a sequence controller 28 is provided. The sequence controller 28 moves the major deflector for a fine distance according to the position of the major deflector, the target position of the stage 5, and the present position of the stage 5. This process is repeated within a period corresponding to the latency time, thereby gradually moving the major deflector toward the specified position R1 in the subfield S2.

The sequence controller 28 for collectively controlling the whole process comprises a microcomputer, or a digital signal processor (DSP), and firstly provides an instruction to shift the major deflector from a certain subfield to a specific position in an adjacent subfield. A subfield pattern generator 4 is then stopped to prevent exposure data from flowing to an exposure processing circuit. Thereafter, the sequence controller 28 provides an instruction to a latency time generator 21, which generates a pulse at an interval of Δt. In response to the pulse, a subtracter 10 subtracts a present position of the stage stored in a stage read register 8 from a predetermined center position coordinate of the main field stored in a target stage position register 9.

A major deflector position memory 3 stores a center position (Xm, Ym) of the target subfield that is fixed irrelevant to the stage position. An adder 11 adds the center position (Xm, Ym) of the subfield read from the major deflector position memory 3 to an output of the subtracter 10, thereby determining a coordinate vector for newly moving the major deflector.

A result of the addition is once stored in a major deflector shifting coordinate register 12, and passed through a major deflector correction operating circuit 14 to a major deflector DAC 15, thereby moving the major deflector. After the movement, the sequence controller 28 clears the value stored in the stage read register 8 in preparation for the next measurement.

The latency time generator 21 of the embodiment can generate a settling time T1.

In this embodiment, the fine distance for moving the major deflector can optionally be determined. It is preferable to be, for example, a distance that does not exceed a stage feedback quantity of the minor deflector.

The stage continuously moves at a speed of, for example, 50 mm/sec.

If a distance between the positional coordinate of a first subfield to be exposed and the present position of the major deflector is 2 mm, the latency time necessary for a jump of 2 mm by the major deflector will be 1 msec, so that a set of processes including a process of reading a stage position into the stage read register 8, a process of calculating a major deflector shifting position, a process of correcting differences, and a process of setting DACs is carried out every 10 μsec.

During the period of 10 μsec, the stage only moves 0.5 μm even at the speed of 50 mm/sec, so that a stage feedback state of a subfield is nearly equal to an initial state.

The set of processes for each interval of 10 μsec is repeated 100 times to pass the latency time of 1 msec, and then exposure is started. In this method, an amount of one movement of the major deflector is small, and therefore, the movement needs no significant settling time.

During the settling time needed for a shift of the major deflector from one subfield to an adjacent subfield, the conventional techniques do nothing. The present invention, however, gradually moves the major deflector during the settling time, thereby shortening the exposure time and improving the throughput of the exposure system.

The present invention is realized by a combination of the latency time generator 21 for generating a latency request signal according to a jump distance of the major deflector, and the sequence controller 28 that periodically reads the position of the stage, determines the movement of the major deflector, calculates correction values for the major deflector, accesses the memories, and sets signals in the focus DAC, stigmatism DAC and major deflector DAC, until the latency time elapses, and after the latency time, activates the pattern generator.

After the latency time, the latency time generator 21 provides a latency end signal to the sequence controller 28. According to this signal, the sequence controller 28 provides a pattern generating signal to the pattern generator 4 to adjust the minor deflector and carry out the exposure process.

In the above embodiment, the major deflector is adjusted for every 10 μsec interval. This fine interval is optional, i.e., selectively variably, and is determined according to the speed of the stage and the amount of feedback. Namely, the fine interval is set such that the minor deflector feedback quantity for compensating the movement of the stage does not exceed a certain value.

In this embodiment, each of the subfields S1 to Sn has pattern data exposure sections R1 to Rn. After the major deflector is shifted and fixed at the center of one subfield, the latency time generator 21 provides a settling time signal. According to this signal, the sequence controller 28 provides a minor deflector shifting instruction, which drives a minor deflector deflection correction processing circuit that comprises the laser receiver 6, stage laser counter 7, stage read register 8, subtracter 22, minor deflector feedback correction operating circuit 23, DAC 24, and minor deflector amplifier 25. The minor deflector is, accordingly, selectively shifted to the pattern data exposure sections R1 to Rn one after another to expose each section at a time with the movement of the stage being compensated.

Another method of the present invention will be explained with reference to FIG. 5 (hereinafter, parts (a), (b) and (c) thereof identified as FIGS. 5(a), 5(b), and 5(c)). These figures show the movement of the major deflector, exposure processes, and the movement of the minor deflector when the major deflector presents a settling state indicated with a dashed line K' of FIG. 4.

In FIG. 5(a), the major deflector is ready to be shifted from one subfield to a next subfield. At time t0, the major deflector DAC 15 provides a jump instruction of $\overline{X}1$, and the major deflector is shifted from a point P to a point Q. At this point Q, the sequence controller 28 starts to operate according to a signal from the latency time generator 21, to repeatedly move the major deflector for a fine distance at each interval Δt, thereby gradually moving the major deflector to the target $\overline{X}1$. At time t1 after a predetermined settling time T1, the major deflector reaches the position of $\overline{X}1$. During this settling time, the stage is continuously moving, so that the major deflector is moved as shown in FIG. 5(a) from time t0 to time t1. During this period between t0 and t1, the minor deflector repeats fine movements according to a feedback signal as shown in FIG. 5(c) in synchronism with the intermittent fine movements of the major deflector.

At time t1, the major deflector is fixed at the center of the subfield S1 (FIG. 5(b)). The minor deflector starts to expose the pattern data exposure sections in the subfield S1. During this period from time t1 to time t2, the major deflector is fixed at the center of the subfield S1, so that a set signal for the major deflector DAC 15 will not change. The minor deflector scans the subfield S1 while being feedback-controlled according to a feedback signal shown in FIG. 5(c) between time t1 and time t2, for compensating for the movement of the stage The same operations will be repeated for the subfields S2 to Sn. During the operations, the major deflector is shifted and corrected in a stepwise manner in response to the movements of the stage as shown in FIG. 5(a).

Figure 4:
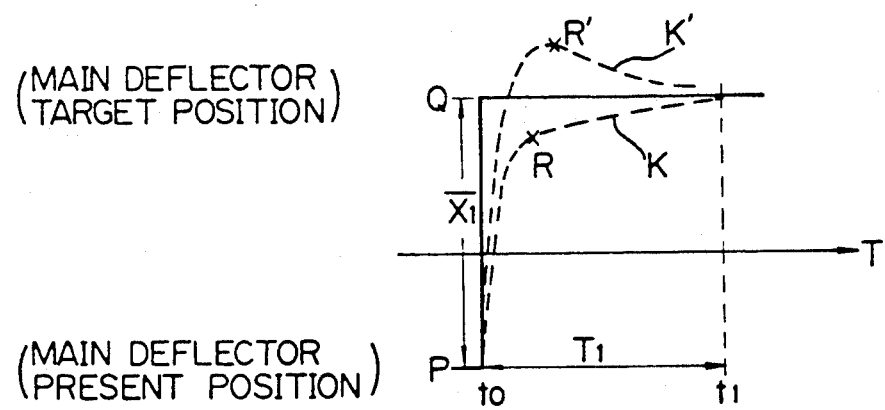
FIG. 4 is a view showing a settling state of a major deflector.

In this invention, the major deflector may intermittently move from its present position after receiving a jump instruction. As shown in FIG. 4, the major deflector may move to a point R on the dotted line K or a point R' on the dotted line K' after receiving the jump instruction, and thereafter, intermittently move to a target position The latter is advantageous in saving time.

A sequence of operations of the above embodiment will be explained with reference to the flowchart of FIGS. 6A and 6B (hereafter, FIG. 6).

After starting, the sequence controller 28 provides an instruction, according to which center coordinates (Xm, Ym) of a target subfield are read out of the major deflector buffer memory 1, and stored in the major deflector position memory 3 (Step a).

The sequence controller 28 provides a stage position reading pulse (Step b), and the present position of the stage, i.e., present positional coordinates (Xst, Yst) of the major deflector are detected and stored in the stage read register 8.

In Step c, the subtracter 10 calculates a difference between a target stage position, i.e., center coordinates (X0, Y0) of a main field read out of the target stage position register 9, and the major deflector present position coordinates (Xst, Yst). Namely, the subtracter 10 calculates $(\Delta X = X0 - Xst, \Delta Y = Y0 - Yst)$.

In Step d, the adder 11 adds the target subfield center coordinates (Xm, Ym) read in Step a to the above difference data, thereby calculating the major deflector shifting distance (vector) (Xnew, Ynew). Here, $Xnew = Xm + \Delta X$ and $Ynew = Ym + \Delta Y$.

In Step e, a settling time T1 is calculated according to the distances Xnew and Ynew obtained in Step d.

The settling time T1 is calculated from the shifting distances Xnew and Ynew and preceding shifting distances Xold and Yold according to the following equation:

$$T1 = [(A \times \{Xnew - Xold\} + B) \mu s, (A \times \{Ynew - Yold\} + B) \mu s]$$

where coefficients A and B are determined such that T1 is about 1 msec for a 2-mm jump and about 20 μsec for a 100-μm jump. The larger one of the values of X and Y directions is selected as the settling time T1.

Once the settling time T1 is determined, the major deflector is repeatedly moved, each time for a fine distance, as mentioned before. During these repeated operations, Step f judges whether or not the settling time is ended. If NO is determined, step g is executed, in which the latency time generator 21 generates a stage position read pulse at an interval of Δt. If in Step f YES is determined, Step h is executed, in which the start of an exposing process is delayed by a predetermined short time. This is to compensate for the last fine movement of the major deflector.

In Step i, the minor deflector is sequentially shifted to expose pattern data exposure sections in the subfield according to respective pattern data therefor.

Step j judges whether or not the exposing process of the subfield is completed. If NO is determined, Step j is repeated. If YES is determined, Step h is executed, in which it is judged whether or not all of subfields have been exposed according to pattern data. If the judgment is YES, the process ends. If it is NO, the process returns to Step a in which pattern data for another subfield different from the just completed subfield are read, and the above-mentioned processes are repeated.

Another method according to the present invention will be explained.

Figure 8B:
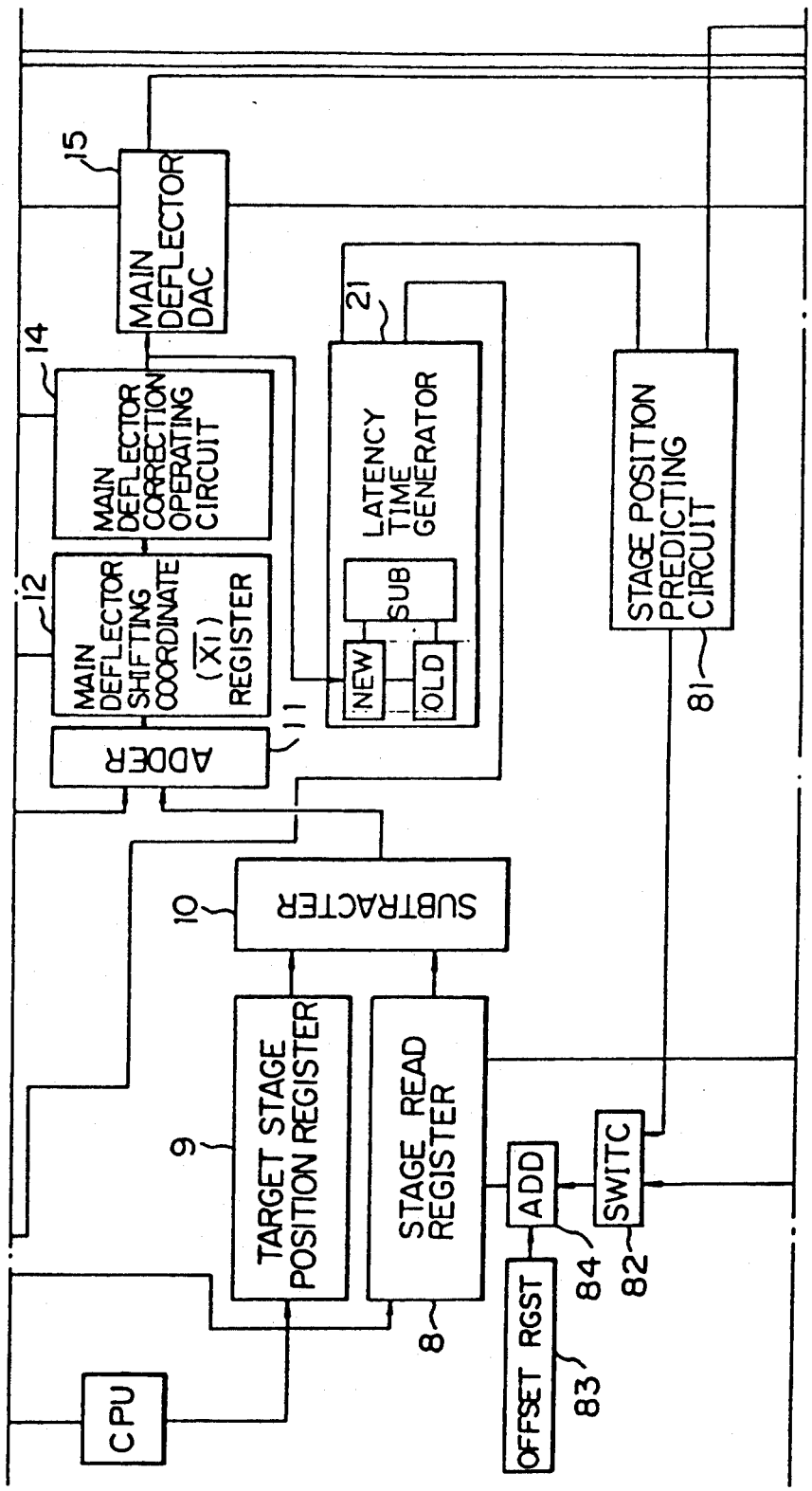
Figure 8C:
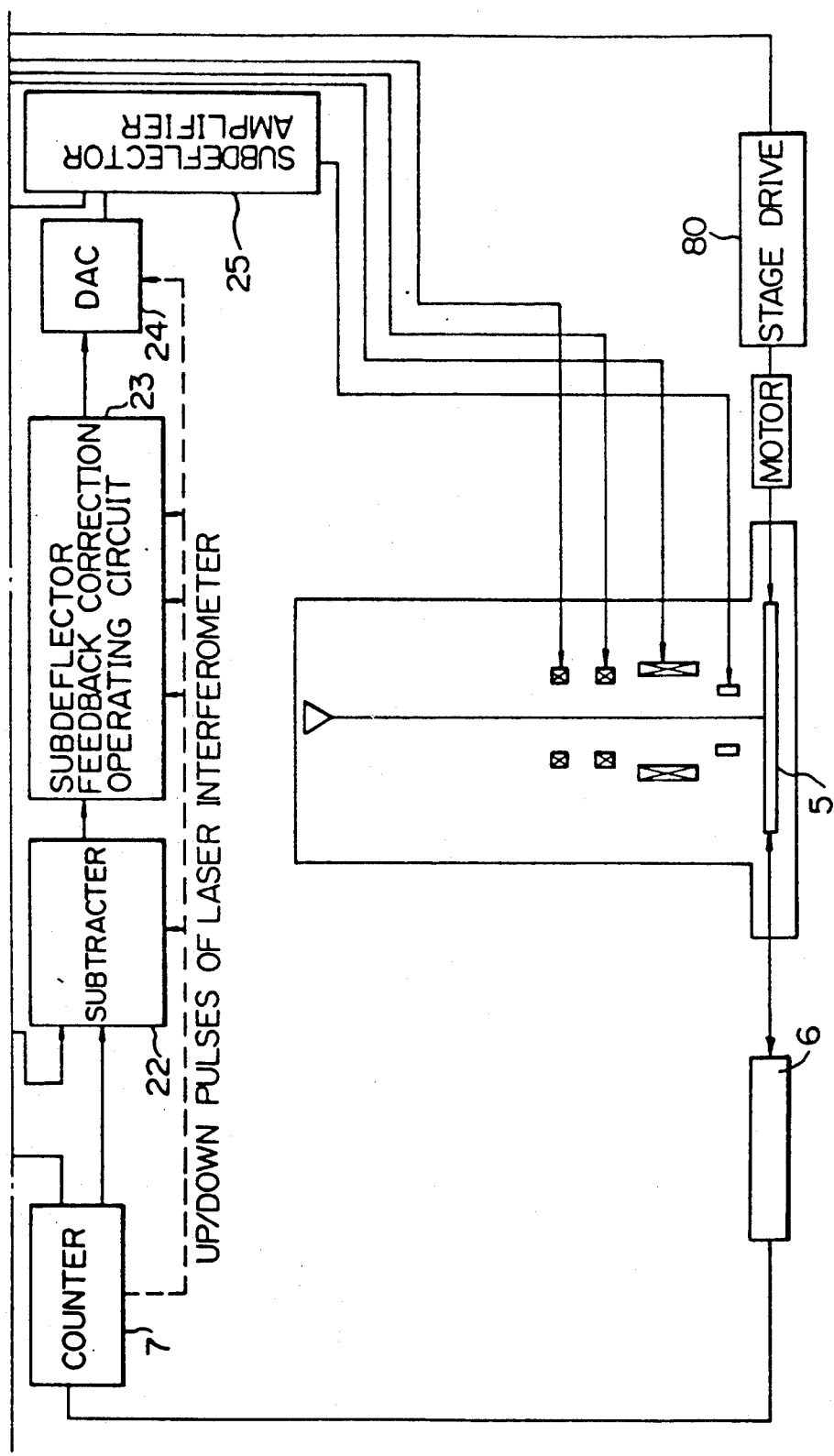

In this method, a settling time needed for a jump of the major deflector is calculated, a location where the major deflector is to be after the settling time is predicted, and the major deflector is shifted at first to the predicted position. More precisely, the major deflector is previously deflected to the predicted position and when the stage reaches at the predicted position, the exposing operation is quickly started. FIGS. 8A to 8C (hereafter, FIG. 8) comprise a block diagram showing an arrangement for achieving this method.

The arrangement of FIG. 8 is substantially the same as that of FIG. 3. The difference is that the arrangement of FIG. 8 involves a stage position predicting circuit 81 for predicting the position of the stage according to an output of the latency time generator 21. The output of the stage position predicting circuit 81 is connected to the stage driver 80, and to the stage read register 8 via a switch 82 and an adder 84.

According to an output signal of the latency time generator 21, the stage position predicting circuit 81 carries out a predicting operation, and the switch 82 selects a laser counter to read the present position of the stage thereby to calculate a latency time. The stage moving speed is read from the stage driving circuit, and the position of the stage at the end of the latency time is calculated in the stage position predicting circuit. Thereafter, the switch 82 is switched to select the predicted position after the latency time, and the major deflector is moved to the predicted position.

FIGS. 7A and 7B (hereafter, FIG. 7) comprise a flowchart of the execution of the above embodiment of the present invention. In this flowchart, Steps a to e are the same as those of FIG. 6.

In Step f, a position (Xsw, Ysw) of the stage at the end of a settling time is predicted, and a difference between the predicted position and a target position (X0, Y0) of the stage, i.e., a difference ($\Delta X'$, $\Delta Y'$) of the stage at the end of the settling time is calculated. Here, $\Delta X'$ and $\Delta Y'$ are expressed as follows:

$$\Delta X' = X0 - Xsw$$

$$\Delta Y' = Y0 - Ysw$$

In the next Step g, shifting vector values X'new and Y'new of the major deflector at the end of the settling time are calculated according to the following equations:

$$X'new = Xm + \Delta X'$$

$$Y'new = Xm + \Delta Y'$$

In Step g, according to the calculated shifting vector values X'new and Y'new, the major deflector is shifted in advance to the major deflector predicted position (Xsw, Ysw) and fixed there.

In Step h, it is judged whether or not the settling time has passed. If the judgment is YES, Steps i to l that are the same as the Steps h to k of FIG. 6 are carried out in which exposure sections are exposed according to pattern data.

To expose the pattern data exposure sections R1 to Rn of the subfield, it is usual to move the minor deflector at a predetermined speed. Pattern data for the exposure sections are not uniform but some are sparse and some are dense. This may cause pattern exposing time to fluctuate. If a processing time is set according to one of the dense sections, it results in wasted time in exposing the sparse sections. If the processing time is set according to one of the sparse sections, an overflow occurs in exposing the dense sections.

If the moving speed of the stage is slow, the problem of overflow hardly occurs. When the moving speed of the stage becomes faster, the time necessary for drawing patterns in a subfield becomes shorter, so that, if dense patterns must be drawn in a subfield, the pattern may not completely be drawn within a specified time.

Figure 9:
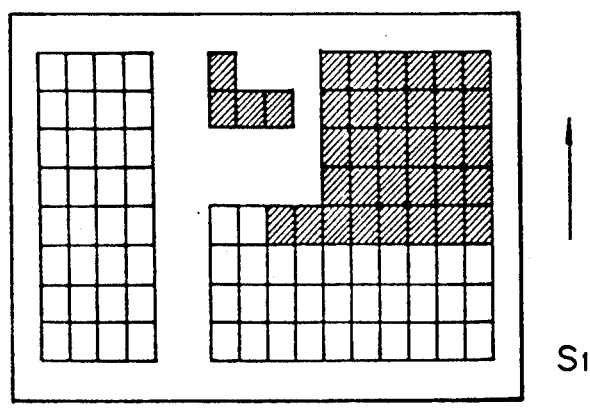
FIG. 9 is a view showing an overflow state.

Namely, when the pattern density of a certain subfield is high as shown in FIG. 9, the pattern may not be completely drawn in a stage moving time, and an overflow occurs for a hatched portion of the subfield. The minor deflector has a scan range, i.e., a margin of, for example, $100 \pm 10 \mu m$ with the size of the subfield being $100 \mu m$. When the stage moves beyond a difference of $\pm 10 \mu m$ between the scanning range and the size of the subfield, it is judged that an overflow has occurred. In this case, the patterns are not completely drawn in the subfield.

If the overflow occurs, the exposing operation is stopped momentarily, a difference with respect to the stage position is read, and a latency time is set. When the major deflector again comes into a drawable range, DACs are set to restart the drawing of the patterns in the same subfield. According to this technique, shots of beams are interrupted during exposure of the patterns, so that the resist layer may unevenly be heated by the beams. As a result, exposure shots before the interruption will not smoothly continue to exposure shots after the interruption.

This is a drawback of the technique of stopping the exposure momentarily at the occurrence of an overflow and resuming the exposure a certain period after the overflow. It is also preferable not to stop drawing patterns in the middle of an exposure because the beams can drift, causing defects in the patterns. It is however impossible to predict which pattern shots will cause an overflow over the minor deflector scan range.

Since it is possible to find the moving speed of stage according to a current density and pattern density, it is possible to know from the speed of the stage the amount of travelling time the stage needs within the feedback margin of 10 $\mu m$ of the minor deflector. It is also possible to find the number of patterns drawable during the time. According to these data, a subfield that may cause an overflow is divided into small areas in advance, and the areas are exposed at the same position so that they may overlap each other.

Figure 10:
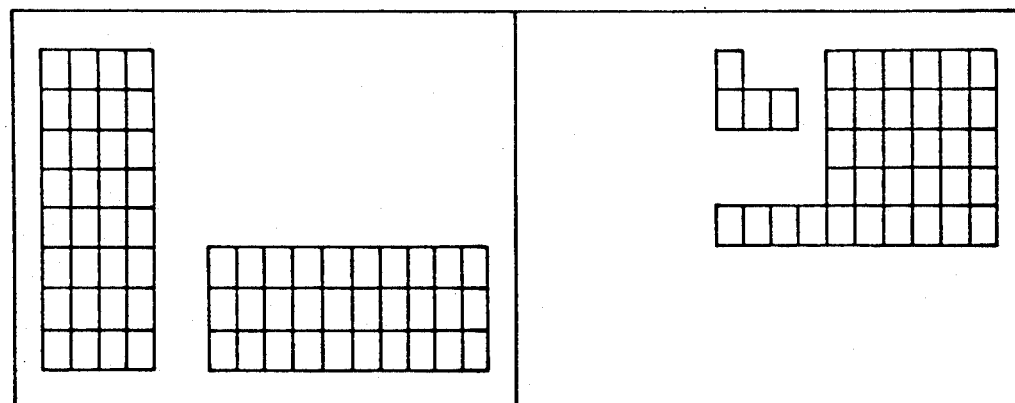
FIG. 10 is a view showing one subfield of FIG. 5 that is predicted to overflow and is divided into two to prevent it from overflowing.

Namely, the subfield of FIG. 9 is divided into a first small area involving patterns that are drawable within a predetermined period and a second small area that includes remaining patterns, as shown in FIG. 10. Each of the small areas has an identical major deflector position. The division of subfields can be done by processing the pattern data of the subfields in advance.

According to this technique, patterns in a subfield are divided into several groups so that each group of patterns may be drawn within a period during which the stage exists in a possible feedback range of 20 $\mu m$. If a major deflector position is in a subfield involving densely arranged small patterns which would take a very long exposure time, the subfield can be divided into several subfields having the same major deflector coordinates, thereby preventing the subfields from overflowing.

In the above embodiment, data of the two small areas are exposed at the same position but with the major deflector being provided with different positional coordinates for the two areas, respectively, because the stage is moving. Namely, to draw the second small area after drawing the first small area, the major deflector must be shifted by the same distance by which the stage has moved during the exposure of the first small area.

As explained above, according to the present invention, even if a stage is continuously moving at a high speed and even if a settling time of a major deflector is long, a charged particle beam exposure system can stably expose a sample. The present invention can prevent a minor deflector feedback control for compensating the movement of the stage from overflowing in setting the major deflector and exposing subfields of the sample, thereby drawing patterns on the sample stably and reliably.

We claim:

1. A method of controlling charged particle beams in a charged particle beam exposure system in which a sample is placed on a stage that is continuously moved, the sample having a plurality of main fields each including a plurality of subfields and each of which subfields includes a plurality of exposure sections, the system employing a major deflector having a wide beam deflecting width and a minor deflector having a narrow beam deflecting width for exposing the sample by a charged particle beam and thereby to draw selected patterns on the sample, the method comprising the steps of:
   successively shifting the major deflector so as to move the beam successively from one subfield to another one of the subfields and, for each shift, fixing the major deflector at a position corresponding to locating the beam at a particular position in the respective subfield;
   successively shifting the minor deflector so as to move the beam successively to the plurality of exposure sections in the subfield corresponding to the fixed position of the major deflector and for each shift, selectively exposing the corresponding exposure section by the charged particle beam according to respective, selected pattern data and thereby drawing a corresponding, selected pattern thereon; and
   in each shift of the major deflector from one subfield to another one of the subfields, positively moving the major deflector so as to correspondingly, positively move the beam toward the particular position of the respective subfield for a period of time corresponding to the settling time that is normally needed for a subfield-to-subfield jump of the major deflector.

2. A method as set forth in claim 1, wherein the major deflector, in each shift from one subfield to another one of the subfields, is intermittently, positively moved at respective, predetermined fine intervals so as to correspondingly, intermittently move the beam toward the particular position of the respective subfield for the period of time corresponding to the settling time that is normally needed for a subfield-to-subfield jump of the major deflector.

3. A method as set forth in claim 1, further comprising the steps of:
   calculating the settling time that is normally needed for a subfield-to-subfield jump of the major deflector;
   predicting, based on the calculated settling time, the position at which the major deflector is to be fixed after the calculated settling time; and
   shifting the major deflector to the predicted, fixed position.

4. A method of controlling charged particle beams in a charged particle beam exposure system in which a sample is placed on a stage that is continuously moved, the sample having a plurality of main fields each including a plurality of subfields and each of which subfields includes a plurality of exposure sections, the system employing a major deflector having a wide beam deflecting width and a minor deflector having a narrow beam deflecting width for exposing the sample by a charged particle beam and thereby to draw selected patterns on the sample, the method comprising the steps of:
   successively shifting the major deflector so as to move the beam successively from one subfield to another one of the subfields and, for each shift, fixing the major deflector at a position corresponding to locating the beam at a particular position in the respective subfield;
   successively shifting the minor deflector so as to move the beam successively to the plurality of exposure sections in the subfield corresponding to the fixed position of the major deflector and for each shift, selectively exposing the corresponding exposure section by the charged particle beam according to respective, selected pattern data and thereby drawing a corresponding, selected pattern thereon; and
   dividing each subfield having a probability of causing an overflow into a plurality of small areas in advance of shifting the major deflector thereto, and, for each such divided subfield, successively shifting the major deflector to, and fixing the major deflector at a small area-related position corresponding to locating the beam at a particular position in the respective small area, in succession for the plurality of the small areas in each such divided subfield, thereby successively exposing the small areas of each such divided subfield.

5. A charged particle beam exposure system in which a sample is placed on a stage that is continuously moved, the sample having a plurality of main fields each including a plurality of subfields and each of which subfields includes a plurality of exposure sections, the system employing a major deflector having a wide beam deflecting width and a minor deflector having a narrow beam deflecting width for exposing the sample by charged particle beams and thereby to draw selected patterns on the sample, the system comprising:
   first shifter means for successively shifting the major deflector so as to move the beam successively from one subfield to another one of the subfields and, for each shift, fixing the major deflector at a position corresponding to locating the beam at a particular position in the respective subfield;
   second shifter means for successively shifting the minor deflector so as to move the beam successively to the plurality of exposure sections in the subfield corresponding to the fixed position of the major deflector;
   first controller means for controlling both said first and second shifter means in exposing the exposure sections with the beam;

third shifter means for positively moving the major deflector, for each shift of the major deflector from one subfield to another one of the subfields, so as to correspondingly, positively move the beam toward the particular position of the respective subfield for a period of time corresponding to the settling time that is normally needed for a subfield-to-subfield jump of the major deflector; and second controller means for supplying successive exposure instructions to expose the respective exposure sections, after completion of operation of said third shifter means.

6. A system as set forth in claim 5, wherein said third shifter means intermittently and positively moves the major deflector at respective, predetermined intervals so as to correspondingly, intermittently and positively move the beam, for the time period corresponding to the settling time, thereby gradually shifting the major deflector and correspondingly gradually shifting the beam to the particular position of the subfield.

7. A system as set forth in claim 6, wherein said third shifter means comprises:

jump instruction generator means for generating an instruction for jumping the major deflector;

latency time generator means for stopping the exposing process for a time period corresponding to the settling time, in response to the jump instruction generated by said jump instruction generator means;

detector means for detecting a present position of said major deflector in response to a signal generated at predetermined time intervals during the time period of activation of said latency time generator;

calculator means for calculating a difference between the present position and a target position of said major deflector;

processor means for computing a difference between the calculated difference and the center position of the subfield, thereby determining a correction value for the movement of said major deflector;

adjustor means for moving said major deflector according to the correction value; and third controller means for stopping the movement of said major deflector after a predetermined time period, again detecting the present position of said major deflector, and repeating the the functions of said jump instruction generator means, said latency time generator means, said detector means, said calculator means, said processor means and said adjustor means for a predetermined period.

8. A method of controlling charged particle beams in a charged particle beam exposure system for exposing a sample by a charged particle beam and thereby to draw selected patterns on the sample, in which the sample is placed on a stage that is continuously moved, the sample having a plurality of main fields each including a plurality of subfields and the system employing a major deflector which deflects the charged particle beam by an electromagnetic force, the method comprising the steps of:

successively shifting the major deflector so as to move the beam successively from one subfield to another of the subfields and, for each shift, fixing the major deflector at a position corresponding to locating the beam at a particular position in the respective subfield; and in each shift of the major deflector from one subfield to another of the subfields, positively moving the major deflector so as to correspondingly, positively move the beam toward the particular position of the respective subfield for a period of time corresponding to the settling time normally needed for a subfield-to-subfield jump of the major deflector.

9. A charged particle beam exposure system exposing a sample by a charged particle beam to thereby draw selected patterns on the sample, in which the sample is placed on a stage that is continuously moved, the sample having a plurality of main fields each including a plurality of subfields and the system employing a major deflector which deflects the charged particle beam by an electromagnetic force, the system comprising:

first shifter means for successively shifting the major deflector so as to move the beam successively from one subfield to another of the subfields and, for each shift, fixing the major deflector at a position corresponding to locating the beam at a particular position in the respective subfield; and second shifter means for positively moving the major deflector, for each shift of the major deflector, from one subfield to another of the subfields, so as to correspondingly, positively move the beam toward the particular position of the respective subfield for a period of time corresponding to the settling time normally needed for a subfield-to-subfield jump of the major deflector.

* * * * *

UNITED STATES PATENT AND TRADEMARK OFFICE
CERTIFICATE OF CORRECTION

PATENT NO. : 5,134,300
DATED : July 28, 1992
INVENTOR(S) : Junichi KAI et al.

It is certified that error appears in the above-indentified patent and that said Letters Patent is hereby corrected as shown below:

Col. 3, line 51, change "delector" to --deflector--.

Col. 5, line 1, after "deflector" insert --and--;
line 4, change "sponding" to --spondingly--;
line 6, after "deflector" insert --and--.

Col. 9, line 61, after "stage" insert --,--.

Col. 10, line 28, after "=" delete "r".

Col. 12, line 13, after "subfield" insert --,--.

Col. 14, line 39, after "at" insert --,--.

Col. 15, line 47, change "the the" to --the--.

Signed and Sealed this

Eighth Day of March, 1994

Attest:

BRUCE LEHMAN

Attesting Officer

Commissioner of Patents and Trademarks